(12) United States Patent
Hannan et al.

(10) Patent No.: US 6,407,541 B1
(45) Date of Patent: Jun. 18, 2002

(54) DOCKING MECHANISM FOR SEMICONDUCTOR TESTER

(75) Inventors: James M. Hannan; Jeffrey S. McMullin, both of Portland, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/364,685

(22) Filed: Jul. 30, 1999

(51) Int. Cl.[7] .............................................. G01R 31/02
(52) U.S. Cl. ..................... 324/158.1; 324/754; 324/758
(58) Field of Search .............................. 324/158.1, 758, 324/754

(56) References Cited

U.S. PATENT DOCUMENTS

| | | | | |
|---|---|---|---|---|
| 4,063,172 A | * | 12/1977 | Faure et al. ................. | 324/756 |
| 4,714,879 A | * | 12/1987 | Krause ........................ | 324/761 |
| 5,068,601 A | * | 11/1991 | Parmenter ................... | 324/754 |
| 5,150,041 A | * | 9/1992 | Eastin et al. ................. | 324/758 |
| 5,422,575 A | * | 6/1995 | Ferrer et al. ................. | 324/754 |
| 5,471,148 A | * | 11/1995 | Sinsheimer et al. ......... | 324/754 |
| 5,644,246 A | * | 7/1997 | Lee et al. .................... | 324/754 |
| 5,966,023 A | * | 10/1999 | Burgers et al. .............. | 324/761 |
| 6,043,667 A | * | 3/2000 | Cadwallader et al. ....... | 324/758 |

* cited by examiner

*Primary Examiner*—Michael J. Sherry
*Assistant Examiner*—Jermele Hollington
(74) *Attorney, Agent, or Firm*—John Smith-Hill; Smith-Hill and Bedell

(57) ABSTRACT

A docking mechanism docks a test head having a docking plate to a machine having a docking fixture when the docking plate is in a predetermined position with respect to the docking fixture. The test head has cam blocks which are moveable with respect to the docking plate. The docking fixture includes cam followers for engaging cam slots in the cam members when the docking plate is in the predetermined position and the cam blocks are in a first position, so that when the cam blocks are moved to a second position the docking plate and the docking fixture are drawn together. At least two sensors are carried by the docking plate and spaced apart from one another. The sensors cooperate with the docking fixture and are in a first state when the docking plate is not engaged with the docking fixture and the docking plate is being brought towards, but has not attained its predetermined position, and are in a second state when the docking plate attains the predetermined position. A logic function prevents movement of cam blocks from the first position towards the second position when the sensors are in the first state and permits movement of the cam blocks from the first position towards the second position when the sensors are in the second state.

28 Claims, 3 Drawing Sheets

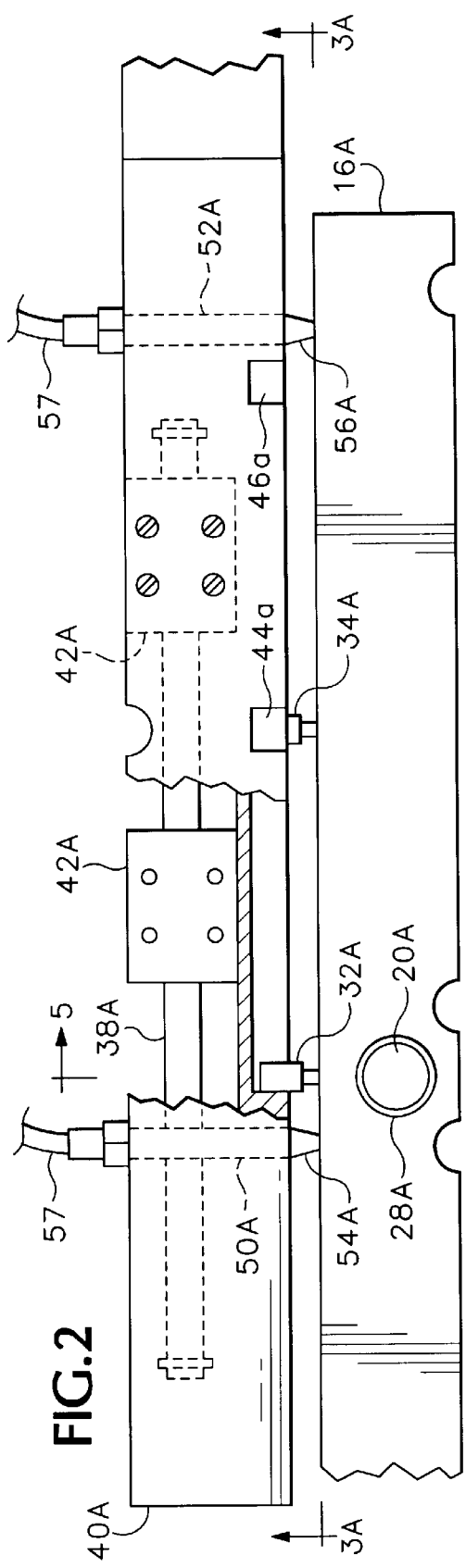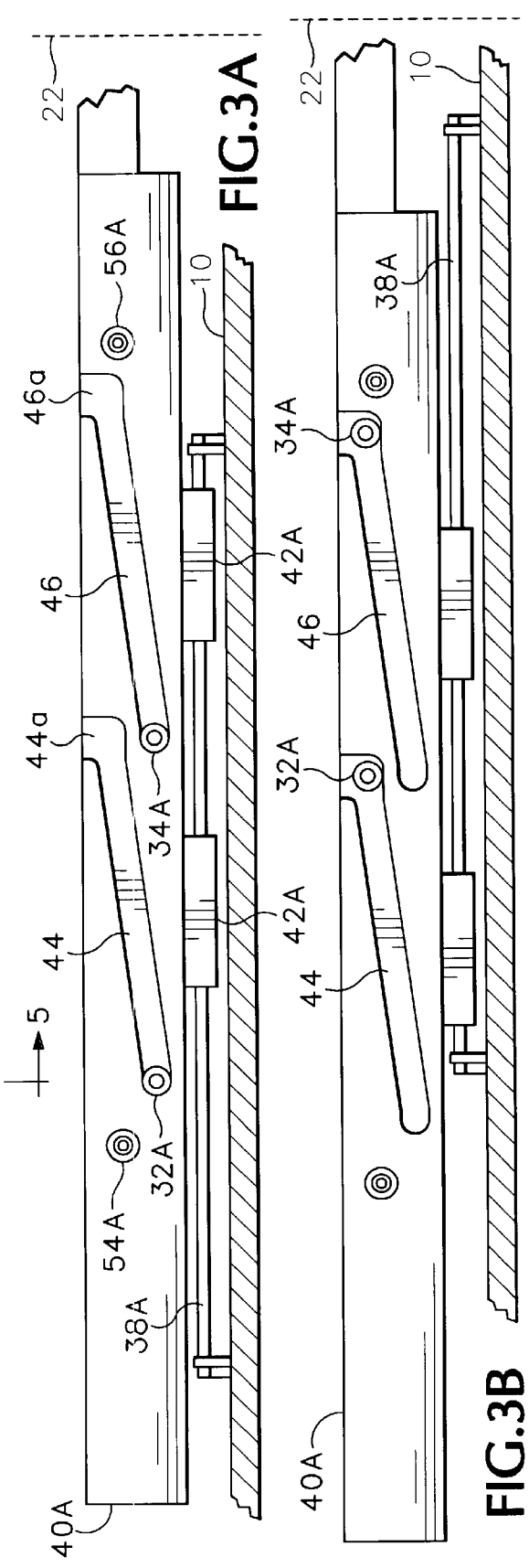

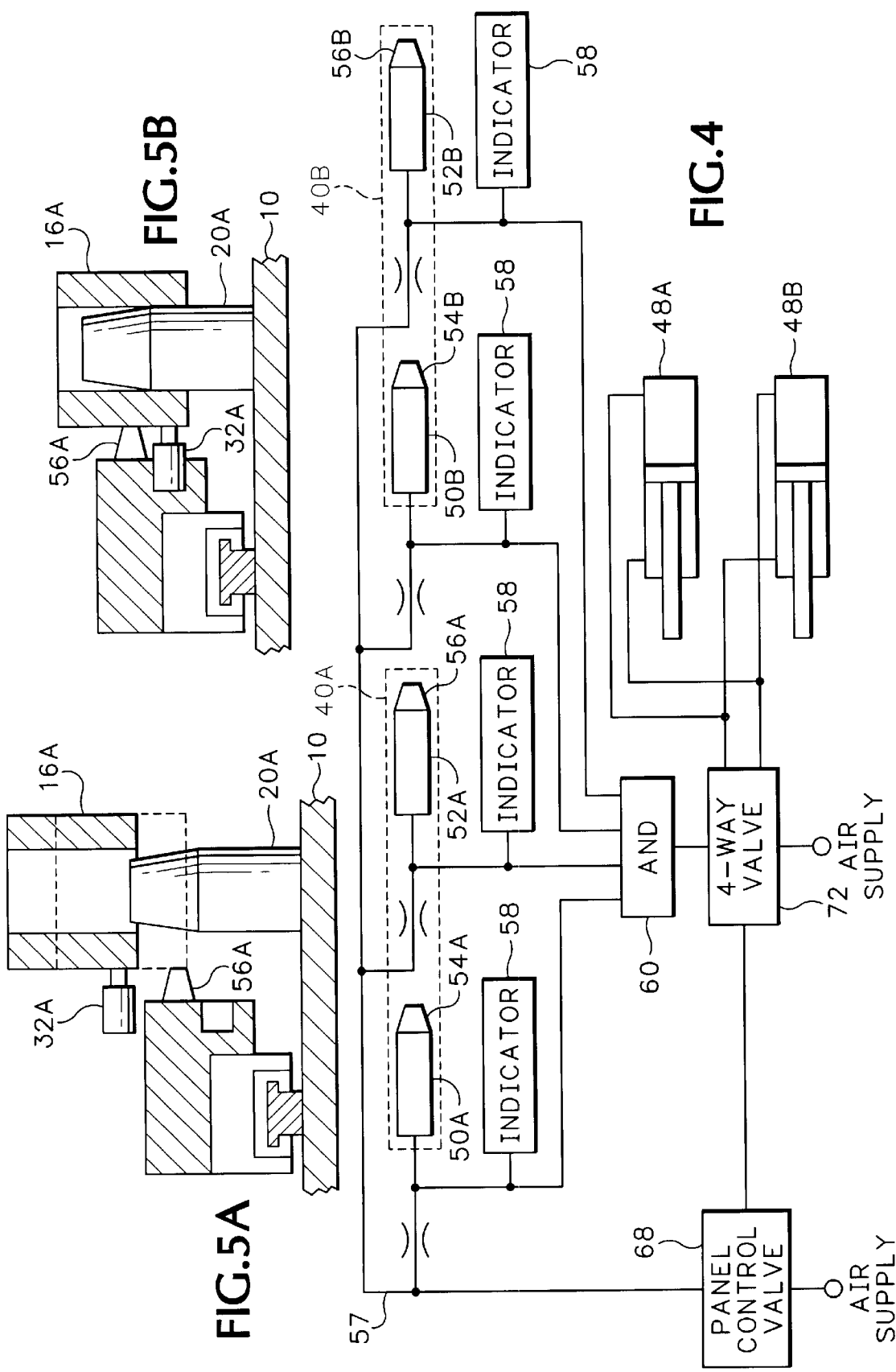

DOCKING MECHANISM FOR SEMICONDUCTOR TESTER

BACKGROUND OF THE INVENTION

This invention relates to an improved docking mechanism for a semiconductor tester.

A semiconductor tester operates in conjunction with another machine, such as a wafer prober, a device handler or a calibration station. In each case, it is necessary to bring a test head of the semiconductor tester to a predetermined position with respect to the other machine (which is referred to hereinafter simply as the machine) and firmly secure, or dock, the test head to the machine employing a mechanical interface which includes a docking plate attached to the test head and docking bars or gussets attached to the machine. Docking is accomplished by lining up guide pins on the docking plate with guide pin sockets in the docking bars. When the guide pins are aligned with the guide pin sockets, cam followers carried by the docking bars are positioned relative to the entrances to respective cam slots in cam blocks that are carried by the docking plate so that on movement of the test head toward the machine along a docking axis parallel to the guide pins, the cam followers will enter the entrances to the cam slots. When the cam followers are properly positioned in the entrances to the cam slots, the cam blocks are displaced relative to the docking plate and the docking bars. Cooperation of the cam blocks with the cam followers pulls the docking plate and the docking bars firmly together.

It is necessary that the test head be accurately positioned relative to the machine, both with respect to planarity and with respect to translation, with the cam followers properly received in the entrances to the cam slots, before the cam blocks are displaced for docking the test head to the machine. Otherwise, the cam blocks may collide with the cam followers, resulting in damage to the mechanism for driving the cam blocks. However, it can be difficult to determine whether the test head is properly positioned relative to the machine, and, if it is not, the nature of the error in positioning because it is difficult to view the cam followers and the cam slots when the docking plate is close to the machine.

In one known arrangement, the cam blocks are moved linearly along parallel paths, parallel to the docking bars, and movement of the cam blocks is coordinated by virtue of the fact that they are connected by a cable which is wrapped around pulleys attached to the docking plate. Movement of the cam blocks is brought about by turning one of the pulleys.

This known type of docking mechanism is subject to disadvantage because it does not include a mechanism for preventing movement of the cam blocks in the event that the cam followers are not properly received in the entrances to the cam slots.

SUMMARY OF THE INVENTION

According to a first aspect of the present invention there is provided a docking mechanism for docking a test head to a machine, wherein the test head includes a first docking structure and cam members which are moveable with respect to the first docking structure between a first position and a second position and the machine includes a second docking structure and cam followers for engaging cam slots in the cam members when the first docking structure is in a predetermined position with respect to the second docking structure and the cam members are in the first position, so that when the cam members are moved to the second position the first and second docking structures are drawn together along a docking axis, the docking mechanism comprising at least two sensors carried by one of the first and second docking structures and spaced apart from one another, the sensors cooperating with the other of the first and second docking structures and being in a first state when the first docking structure is not engaged with the second docking structure and the first docking structure is being brought towards, but has not attained said predetermined position, and being in a second state when the first docking structure attains said predetermined position.

According to a second aspect of the present invention there is provided a docking mechanism for docking a test head having a docking plate and cam members which are moveable with respect to the docking plate between a first position and a second position to a machine having a docking fixture including cam followers for engaging cam slots in the cam members when the docking plate is in a predetermined position with respect to the docking fixture and the cam members are in the first position, so that when the cam members are moved to the second position the docking plate and the docking fixture are drawn together along a docking axis, the docking mechanism comprising at least two sensors carried by the docking plate and spaced apart from one another, the sensors cooperating with the docking fixture and being in a first state when the docking plate is not engaged with the docking fixture and the docking plate is being brought towards, but has not attained said predetermined position, and being in a second state when the docking plate attains said predetermined position.

According to a third aspect of the present invention there is provided a docking mechanism for docking a test head of a semiconductor tester to a machine, wherein the test head has a first docking structure and latch members which are moveable with respect to the first docking structure between a first position and a second position and the machine has a second docking structure including engagement elements for engagement by the latch members when the first docking structure is in a predetermined position with respect to the second docking structure and the latch members are in the first position, so that when the latch members are moved to the second position the first docking structure is drawn towards the second docking structure along a docking axis, the docking mechanism comprising at least two sensors, each sensor being carried by one of the first and second docking structures and cooperating with the other of the first and second docking structures so that the two sensors are sensitive to planarity and translation of the test head relative to the machine, the sensors being in a first state when the first docking structure is being brought towards, but has not attained said predetermined position, and being in a second state when the first docking structure attains said predetermined position.

BRIEF DESCRIPTION OF THE DRAWINGS

For a better understanding of the invention, and to show how the same may be carried into effect, reference will now be made, by way of example, to the accompanying drawings, in which FIG. 2 is a partially cut-away plan view showing a detail of the test head at an enlarged scale, and also illustrates partially a machine to which the test head is docked, FIG. 3A is a view taken on the line 3A—3A of FIG. 2, FIG. 3B is a similar view to FIG. 3A with the test head not docked to the machine, FIG. 4 is a schematic diagram of a pneumatic circuit that is used to control docking of the test head to the machine, and FIGS. 5A and 5B are sectional views taken on the line 5—5 of FIG. 2 at different times during a docking operation.

Figure 1:
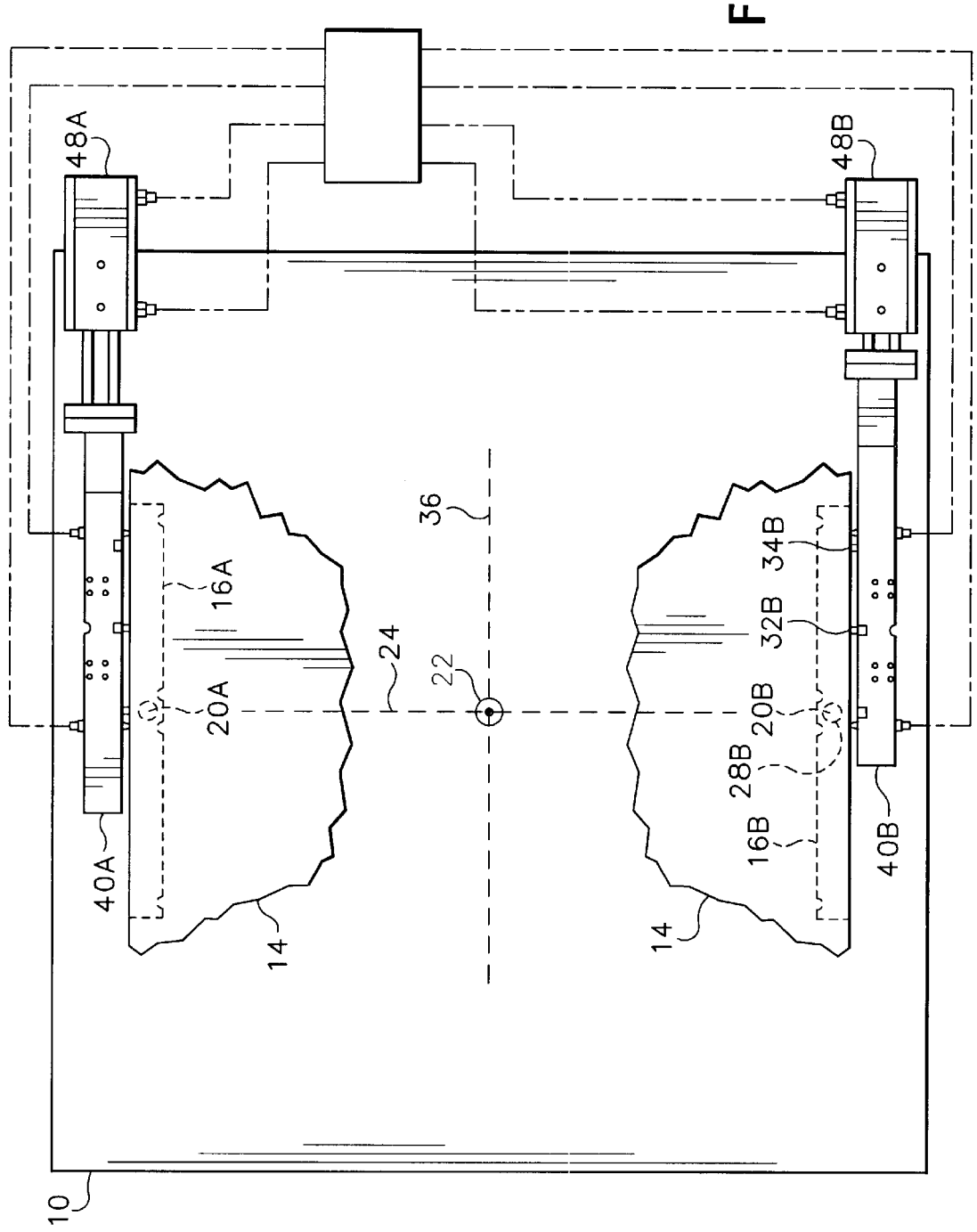
FIG. 1 is a partially schematic plan view of the test head of a semiconductor tester.

Some of the reference signs in the drawings consist of a number and a letter suffix. The letter suffix is used to distinguish two corresponding elements. For example, in FIG. 1, two docking bars are designated 16A and 16B. In the following detailed description, the suffix may be omitted where the description is applicable to each element and a separate description of each element would be redundant.

DETAILED DESCRIPTION

The test head shown in FIG. 1 includes a first docking structure. The first docking structure includes a generally rectangular docking plate 10. Electrical terminals of the tester are exposed through openings in the docking plate. For clarity of illustration, neither the terminals nor the openings are shown.

FIG. 1 also illustrates partially a machine 14 to which the test head is docked. A second docking structure includes two parallel docking bars 16A, 16B which attached to the machine 14.

Referring to FIGS. 1 and 2, two spaced alignment pins 20A, 20B project from the docking plate 10 along a docking axis 22 (FIGS. 3A and 3B). The alignment pins are spaced apart along an axis 24 perpendicular to the docking axis and are illustrated as being adjacent opposite respective edges of the docking plate 10. However, it is not essential that the alignment pins be adjacent opposite edges of the docking plate. The spacing of the alignment pins 20A, 20B matches that of corresponding alignment sockets 28A, 28B in the docking bars 16A, 16B respectively. Each docking bar 16 carries two cam followers 32, 34, each comprising a shaft projecting from the docking bar parallel to the axis 24 and a sleeve journalled on the shaft. The cam followers on each docking bar are spaced apart parallel to an axis 36, which is perpendicular to the axis 24 and to the docking axis.

Two cam block mounting rails 38 are attached to the docking plate 10 adjacent the alignment sockets 28A, 28B respectively. Only one of the cam block mounting rails, designated 38A, is shown in the drawings. A dual cam block 40 is mounted on each rail 38 by means of a pair of cam block slides 42. The mounting rails 38 and the slides 42 constrain movement of the dual cam blocks relative to the docking plate 10, such that the cam blocks are able to move parallel to the axis 36. Each dual cam block 40 is formed with two cam slots 44, 46, the cam slots having entrances 44a, 46a respectively. The cam blocks 40A, 40B are connected to be driven by double-acting pneumatic cylinders 48A, 48B between a locked position (FIGS. 1 and 3A) and a releasing position (FIG. 3B).

In FIG. 2, part of one of the dual cam blocks is shown in cut away view to illustrate the cam block mounting rail 38 to which the dual cam block 40 is secured by the cam block slides 42.

Referring to FIGS. 2 and 4, each dual cam block is formed with two bores 50, 52 which are provided with respective nozzles 54, 56 debouching towards the other cam block. A panel control valve 68 has an inlet connected to a supply of compressed air, which may be filtered and regulated, and has a first outlet connected by flexible tubes 57 to the bores 50 and 52 and a second outlet connected to a first control port of a piloted four-way valve 72. The panel control valve 68 has an enable or armed position, in which its first outlet is at high pressure, a disengage position in which its second outlet is at high pressure, and an off position, in which neither outlet is at high pressure.

The bores 50, 52 are connected to respective pneumatic indicators 58, such that if the pressure in a bore 50 or 52 is low, the corresponding indicator 58 is inactive whereas, the indicator 58 is active if the pressure in the bore is high. The bores 50, 52 are connected to respective inlets of a pneumatic AND gate 60, which provides a high pressure output only if all four inlets are at high pressure. The outlet of the AND gate 60 is connected to a second control port of the four-way valve 72.

The four-way valve 72 has an inlet connected to the supply of compressed air and has two outlets. One outlet is connected to the drive port of the cylinder 48A and the return port of the cylinder 48B, and the other outlet is connected to the drive port of the cylinder 48B and the return port of the cylinder 48A. If the first control port of the four-way valve 72 is at high pressure, the four-way valve is placed in a first or release position, in which it supplies compressed air to the cylinders 48 to drive the two cam blocks 40 to the releasing position, whereas if the second control port of the four-way valve is at high pressure, the four-way valve is placed in a second or engage position, in which it supplies compressed air to the cylinders for driving the two cam blocks 40 towards the locked position.

When the test head is disengaged from the machine 14 (FIG. 5A, solid lines), the nozzles 54, 56 are unobstructed and accordingly compressed air can flow freely from the bores 50, 52 through the nozzles 54, 56. The pressure in each of the bores is low, regardless of the state of the panel control valve 68. The outlet of the AND gate 60 is at low pressure. Accordingly, if the panel control valve is placed in its disengage position, the four-way valve is placed in its release position.

Let us assume an initial state in which the cam followers are not in the cam slots and the panel control valve is in the disengage position. In this state, the cam blocks are both in the released position, all four inlets to the AND gate 60 are at low pressure, and the four-way valve 72 is in the release position. The panel control valve is then switched to the armed position and compressed air is supplied to the bores 50, 52. Since the nozzles are not occluded, air can flow freely from the nozzles and the inlets to the AND gate 60 remain at low pressure. The test head is brought closer to the machine 14 and the alignment pins enter the alignment pin sockets (FIG. 5A). The cam followers are aligned with the entrances to the respective cam slots. The test head is brought still closer to the machine along the docking axis. Ideally, all four cam followers are simultaneously fully received in the entrances to the respective cam slots (FIG. 3B). The docking bars 16 occlude the nozzles 54, 56 (FIG. 5, dashed lines). Compressed air cannot flow freely from the bores and a back pressure is generated in each of the bores 50, 52. All four indicators 58 are rendered active. The inlets to the AND gate 60 go to high pressure and the outlet of the AND gate 60 supplies compressed air to the second control port of the four-way valve 72. The valve 72 shifts to the engage position and the cylinders 48 drive the two cam blocks to the locked position (FIGS. 2, 3A and 5B). The test head is thereby docked to the machine. If the operator then switches the panel control valve 68 to the release position, the four-way valve 72 is driven to the release position and the cylinders drive the cam blocks to the releasing position.

The operator can then use the manipulator (not shown) to move the test head away from the machine so that the cam followers are no longer positioned in the cam slots. In this manner, the initial state is restored. The operator can then switch the panel control valve 68 to the off position.

In practice, the clearance with which the pins 20 fit in the sockets 28 allows a small range of angular movement of the docking plate 10 relative to the machine 14 about the axes 24 and 36. Consequently, one cam follower might be fully received in the entrance to its cam slot before another cam follower is fully received. In this case, at least one inlet of the AND gate 60 is low and the outlet of the AND gate 60 remains low, preventing actuation of the four-way valve to the engage position, even though at least one inlet of the AND gate 60 is high and at least one of the cam followers is fully received in the entrance to its cam slot. Accordingly, the risk of damage to the drive mechanism of the cam blocks by operation of the cylinders before the cam followers are all fully received in the entrances to their respective cam slots is reduced.

Suppose, for example, that initially only the cam follower 32A is fully received in the entrance to its cam slot. The nozzle 54A closest to the cam slot entrance is occluded by the docking bar 16A and one of the indicators is active. The operator can deduce the nature of the motion of the test head required to render the remaining indicator(s) active without having to view the cam followers and the cam slots. The operator can use the manipulator to adjust the position of the test head so that all four indicators are rendered active, indicating that all four cam followers are properly positioned in the entrances to the respective cam slots, and the outlet of the AND gate 60 then goes high.

Each bore 50, 52 and the associated nozzle 54, 56 operates as a pneumatic sensor which detects whether the test head is so positioned relative to the machine that the cam followers are received in the entrances to the respective cam slots. The pneumatic sensors and associated logic guard against the possibility that the cam blocks will be driven towards the locked position unless all four cam followers are properly positioned in the entrances of the respective cam slots. Specifically, if one nozzle is not occluded by the docking bar, the outlet of the AND gate 60 will remain low and will prevent the four-way valve being shifted to the engage position.

Use of the pneumatic cylinders for displacing the cam blocks avoids the need for the cable mechanism that was previously used, which facilitates docking and undocking of the test head.

The pneumatic sensors also facilitate docking because they allow more easy and reliable determination that the test head and the machine are in the proper relative positions for docking.

It will therefore be seen that the docking mechanism that has been described and illustrated ensures that the test head achieves the correct position relative to the machine, both with respect to planarity and with respect to translation, before the cam blocks are driven to the locked position. Accordingly, the possibility of damage to the mechanism for driving the cam blocks due to collision between the cam blocks and the cam followers is reduced.

It will be appreciated that the invention is not restricted to the particular embodiment that has been described and illustrated, and that variations may be made therein without departing from the scope of the invention as defined in the appended claims and equivalents thereof. For example, the invention is not restricted to use of pneumatic sensors since electrical sensors or a mechanical interlock, for example, could be used instead. Further, although in the case of the sensors being pneumatic it is convenient for the sensor bores to be formed in the cam blocks, since their main purpose is to monitor whether the cam followers are properly seated in the entrances to the respective cam slots, the invention also is not limited to the sensor bores being formed in the cam blocks, since they could be located elsewhere on the docking plate. Alternatively, the sensors could be carried by the machine, for example on the docking bars. It is even possible, though not preferred, that one or more sensors be carried by the test head and one or more sensors carried by the machine. Moreover, although the described embodiment of the invention employs two linear cam blocks each having two cam slots, the invention is not restricted to linear cams, to the number of cams being two or to each cam block having two cam slots. In addition, although the pneumatic circuit shown in FIG. 2 has been found to be satisfactory, in another implementation additional logic elements might be necessary to achieve optimum operation. The invention is not restricted to use of pneumatic cylinders to displace the cam blocks and other mechanisms could be used instead, including manual effort and mechanical linkages to coordinate movement of the cam blocks. The invention has been described with reference to an implementation in which the mechanical interface for attaching the test head to the machine is provided by elements that are distinct from the elements that provide the electrical interface between the test head and the machine, but the invention is also applicable to an arrangement in which the mechanical attachment interface is integrated with the structure that provides the electrical interface. For example, the electrical interface may be provided by a support structure which is carried by the test head and contains an array of terminal members, such as pogo pins, and the mechanical interface may be provided by latching members integrated in the support structure. Still further, although the invention has been described with reference to an implementation in which the decision whether to move the cam blocks is made automatically by the logic function described with reference to FIG. 4, the decision could be made by an operator viewing the indicators and actuating the mechanism for displacing the cam blocks only when the indicators show that the test head is properly positioned relative to the machine.

What is claimed is:

1. A semiconductor tester comprising:
    a test head that includes a first docking structure and cam members which are moveable with respect to the first docking structure between a first position and a second position,
    a machine that includes a second docking structure and cam followers for engaging cam slots in the cam members when the first docking structure is in a predetermined position with respect to the second docking structure and the cam members are in the first position, so that when the cam members are moved to the second position the first and second docking structures are drawn together along a docking axis,
    at least two sensors carried by one of the first and second docking structures and spaced apart from one another, the sensors cooperating with the other of the first and second docking structures for sensing whether the first docking structure is in said predetermined position with respect to the second docking structure, the sensors being in a first state when the first docking structure is not engaged with the second docking structure and the first docking structure is being brought towards, but has not attained, said predetermined position, and being in a second state when the first docking structure attains said predetermined position.

2. A semiconductor tester according to claim 1, wherein the first docking structure includes first and second cam members and the docking mechanism comprises two sensors carried by the first cam member and two sensors carried by the second cam member.

3. A semiconductor tester according to claim 1, comprising a power means for driving the cam members between the first position and the second position.

4. A semiconductor tester according to claim 1, wherein the two sensors are spaced apart in a direction perpendicular to the docking axis.

5. A semiconductor tester according to claim 1, wherein said one of the first and second docking structures is the first docking structure.

6. A semiconductor tester according to claim 5, wherein the sensors are integrated in the cam members.

7. A semiconductor tester according to claim 6, wherein the second docking structure comprises docking bars to which the cam followers are mounted and wherein the sensors are positioned to detect proximity of the docking bars to the cam members.

8. A semiconductor tester according to claim 7, where in the sensors are pneumatic sensors each including a bore formed in a cam member and wherein each bore debouches at a port that is occluded by the docking bar when the first docking structure has attained said predetermined position relative to the second docking structure.

9. A semiconductor tester according to claim 1, further comprising a logic function responsive to the sensors that prevents movement of the cam members from the first position towards the second position when the sensors are in the first state and permits movement of the cam members from the first position towards the second position when the sensors are in the second state.

10. A semiconductor tester according to claim 9, wherein the sensors provide a cam control signal in a first state when the first docking structure is not engaged with the second docking structure and the first docking structure is being brought towards, but has not attained said predetermined position, and provide the cam control signal in a second state when the first docking structure attains said predetermined position, and the logic function prevents movement of the cam members from the first position towards the second position when the cam control signal is in the first state and permits movement of the cam members from the first position towards the second position when the cam control signal is in the second state.

11. A semiconductor tester according to claim 10, wherein each sensor provides a sensor signal in a first state when the first docking structure is not engaged with the second docking structure and provides a sensor signal in a second state when the first docking structure attains said predetermined position, and the logic function generates said cam control signal in the first state when at least one of the sensor signals is in the first state and generates said cam control signal in the second state when each of the sensor signals is in the second state.

12. A semiconductor tester according to claim 11, comprising an indicator associated with each sensor for providing a human intelligible indication of the state of the sensor signal generated by the sensor.

13. A semiconductor tester comprising:
a test head having a docking plate and cam members which are moveable with respect to the docking plate between a first position and a second position, a machine having a docking fixture including cam followers for engaging cam slots in the cam members when the docking plate is in a predetermined position with respect to the docking fixture and the cam members are in the first position, so that when the cam members are moved to the second position the docking plate and the docking fixture are drawn together along a docking axis, and at least two sensors carried by the docking plate and spaced apart from one another, the sensors cooperating with the docking fixture for sensing whether the first docking structure is in said predetermined position with respect to the second docking structure, the sensors being in a first state when the docking plate is not engaged with the docking fixture and the docking plate is being brought towards, but has not attained, said predetermined position, and being in a second state when the docking plate attains said predetermined position.

14. A semiconductor tester according to claim 13, wherein the test head has first and second cam members and the docking mechanism comprises first and second sensors carried by the first cam member and third and fourth sensors carried by the second cam member.

15. A semiconductor tester according to claim 13, comprising a power means for driving the cam members between the first position and the second position.

16. A semiconductor tester according to claim 13, wherein the sensors are spaced apart in a direction perpendicular to the docking axis.

17. A semiconductor tester according to claim 13, further comprising a logic function responsive to the sensors for preventing movement of the cam members from the first position towards the second position when the sensors are in the first state and for permitting movement of the cam members from the first position towards the second position when the sensors are in the second state.

18. A semiconductor tester according to claim 17, wherein the sensors provide a cam control signal in a first state when the docking plate is not engaged with the docking fixture and the docking plate is being brought towards, but has not attained said predetermined position, and provide the cam control signal in a second state when the docking plate attains said predetermined position, and the logic function prevents movement of the cam members from the first position towards the second position when the cam control signal is in the first state and permits movement of the cam members from the first position towards the second position when the cam control signal is in the second state.

19. A semiconductor tester according to claim 13, including at least two cam members, and wherein the sensors are integrated in the cam members respectively.

20. A semiconductor tester according to claim 19, wherein the docking fixture comprises docking bars to which the cam followers are mounted and wherein the sensors are positioned to detect proximity of the docking bars to the cam members.

21. A semiconductor tester according to claim 19, wherein the sensors are pneumatic sensors each including a bore formed in a cam member and wherein each bore debouches at a port that is occluded by the docking fixture when the docking plate has attained said predetermined position relative to the docking fixture.

22. A semiconductor tester comprising:
a test head including a first docking structure and latch members which are moveable with respect to the first docking structure between a first position and a second position, a machine including a second docking structure and engagement elements for engagement by the latch members when the first docking structure is in a predetermined position with respect to the second docking structure and the latch members are in the first position, so that when the latch members are moved to the second position the first docking structure is drawn towards the second docking structure along a docking axis, and at least two sensors, each sensor being carried by one of the first and second docking structures and cooperating with the other of the first and second docking structures so that the two sensors are sensitive to whether the first docking structure is in said predetermined position with respect to the second docking structure, the sensors being in a first state when the first docking structure is being brought towards, but has not attained, said predetermined position, and being in a second state when the first docking structure attains said predetermined position.

23. A semiconductor tester according to claim 22, wherein the sensors are carried by the first docking structure.

24. A semiconductor tester according to claim 22, comprising a power means for driving the latch members between the first position and the second position.

25. A semiconductor tester according to claim 22, further comprising a logic function responsive to the sensors which prevents movement of the latch members from the first position towards the second position when the sensors are in the first state and permits movement of the latch members from the first position towards the second position when the sensors are in the second state.

26. A semiconductor tester according to claim 25, wherein each sensor provides a sensor signal in a first state when the first docking structure is not engaged with the second docking structure and provides the sensor signal in a second state when the first docking structure attains said predetermined position, and the docking mechanism includes a logic circuit which generates said latch control signal in the first state when at least one of the sensor signals is in the first state and generates said latch control signal in the second state when each of the sensor signals is in the second state.

27. A semiconductor tester according to claim 26, comprising an indicator associated with each sensor for providing a human intelligible indication of the state of the sensor signal provided by the sensor.

28. A semiconductor tester according to claim 25, wherein the sensors provide a latch control signal in a first state when the first docking structure is being brought towards, but has not attained said predetermined position, and provide the latch control signal in a second state when the first docking structure attains said predetermined position, and the logic function is responsive to the output signal and prevents movement of the latch members from the first position towards the second position when the latch control signal is in the first state and permits movement of the latch members from the first position towards the second position when the latch control signal is in the second state.

* * * * *